United States Patent
Hosaka

[11] Patent Number: 5,210,043
[45] Date of Patent: May 11, 1993

[54] PROCESS FOR PRODUCING SEMICONDUCTOR DEVICE

[75] Inventor: Takashi Hosaka, Tokyo, Japan

[73] Assignee: Seiko Instruments Inc., Tokyo, Japan

[21] Appl. No.: 588,553

[22] Filed: Sep. 26, 1990

[30] Foreign Application Priority Data

Sep. 26, 1989 [JP] Japan .................................. 1-249632

[51] Int. Cl.$^5$ ..................... H01L 21/44; H01L 21/265
[52] U.S. Cl. ...................................... 437/30; 437/200; 148/DIG. 18
[58] Field of Search ...................... 437/200, 30; 148/18

[56] References Cited

U.S. PATENT DOCUMENTS 4,519,127 5/1985 Arai ........................................ 437/30
4,833,519 5/1989 Kawano et al. ..................... 437/195

FOREIGN PATENT DOCUMENTS 0061346 3/1987 Japan ..................................... 437/200
0131538 6/1987 Japan ....................................... 437/30
0089446 4/1989 Japan ..................................... 437/200
0128521 5/1989 Japan ....................................... 437/30
2-365129 11/1991 Japan ....................................... 437/30

Primary Examiner—Olik Chaudhuri
Assistant Examiner—Long Pham
Attorney, Agent, or Firm—Spensley Horn Jubas & Lubitz

[57] ABSTRACT

A process for producing a semiconductor device having a structure in which a silicide film is in contact with an impurity diffusion layer inside a semiconductor substrate through a contact hole, in that, after the formation of the silicide film, an element of the same conductivity type as that of the impurity diffusion layer is implanted by ion implantation in the vicinity of the interface between the silicide film and the impurity diffusion layer through the silicide film.

3 Claims, 4 Drawing Sheets

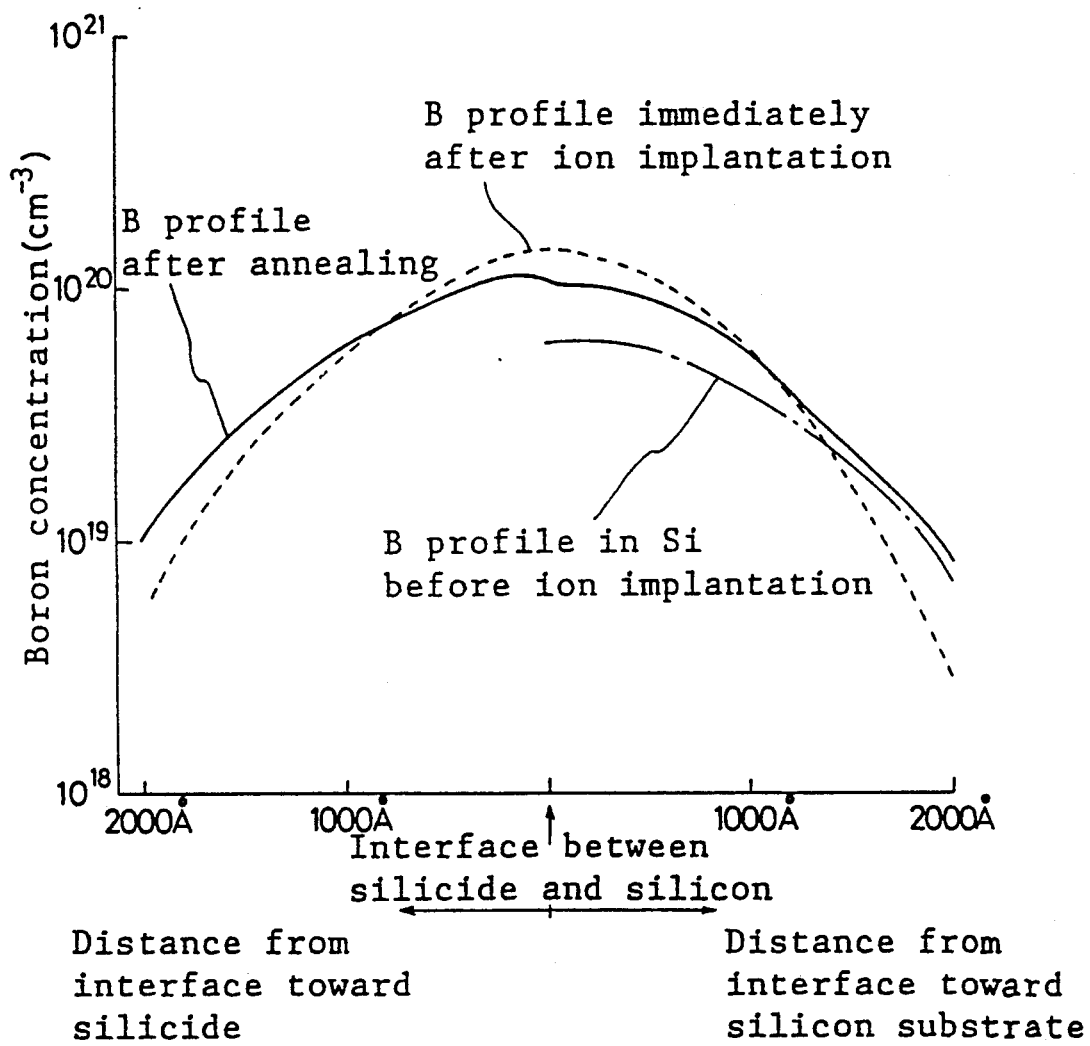

PROCESS FOR PRODUCING SEMICONDUCTOR DEVICE

BACKGROUND OF THE INVENTION

The present invention relates to a process for producing a semiconductor device that has a wiring structure made from a silicide film.

A known process of this type is illustrated in FIGS. 4a and 4b. As shown in FIG. 4a, a film 15 of a silicide (an alloy of silicon and a metal) is deposited and is brought into contact with an impurity diffusion layer 12 provided in a surface layer of a semiconductor substrate 11 of silicon (Si), for example, through contact holes 14 in an insulating layer 13. Thereafter, as shown in FIG. 4b, a second insulating layer 16 and wiring 17 are formed to produce a semiconductor device. Since a heat treatment is carried out at 800° C. or higher, in general, even after the formation of the silicide film 15, impurities in the vicinity of the surface of impurity diffusion layer 12 are absorbed into the silicide. As a result, the impurity concentration in the semiconductor substrate 11 at the interface between the impurity diffusion layer 12 inside substrate 11 and the silicide film 15 is reduced and hence the contact resistance between silicide film 15 and impurity diffusion layer 12 increases.

As a result of the heat treatment that is carried out after the formation of silicide film 15, impurities in the vicinity of the surface of the impurity diffusion layer 12 in the semiconductor substrate 11 are absorbed into the silicide, causing a lowering of the impurity concentration in semiconductor substrate 11 at the interface between impurity diffusion layer 12 and silicide film 15, which results in an increase in the contact resistance between silicide film 15 and impurity diffusion layer 12.

SUMMARY OF THE INVENTION

It is a primary object of the present invention to prevent, or at least minimize, an increase in the contact resistance in devices of the type described above.

The above and other objects are achieved, according to the present invention, in a process for producing a semiconductor device having a structure in which a silicide film is in contact with an impurity diffusion layer inside a semiconductor substrate through a contact hole, in that, after the formation of the silicide film, an element of the same conductivity type as that of the impurity diffusion layer is implanted by ion implantation in the vicinity of the interface between the silicide film and the impurity diffusion layer through the silicide film. Thus, according to the invention, after the formation of the silicide film, impurity ions are implanted into the interface between the silicide and the semiconductor substrate.

As a result of the process according to the present invention, the impurity concentrations in the silicide film, in the interface between the silicide film and the semiconductor substrate and in the surface region of the semiconductor substrate increase, and the silicide itself contains impurities at a high concentration from the beginning. Therefore, there is no possibility that the impurity concentration in the surface region of the semiconductor substrate will decrease to a substantial extent, even if a heat treatment is carried out thereafter. Accordingly, there will be no increase in the contact resistance between the silicide film and the semiconductor substrate.

BRIEF DESCRIPTION OF THE DRAWING

FIG. 3 is a graph showing the depthwise profile of boron concentrations in tungsten silicide deposited on silicon after an implantation operation according to the present invention.

DESCRIPTION OF THE PREFERRED EMBODIMENTS

Figure 1:
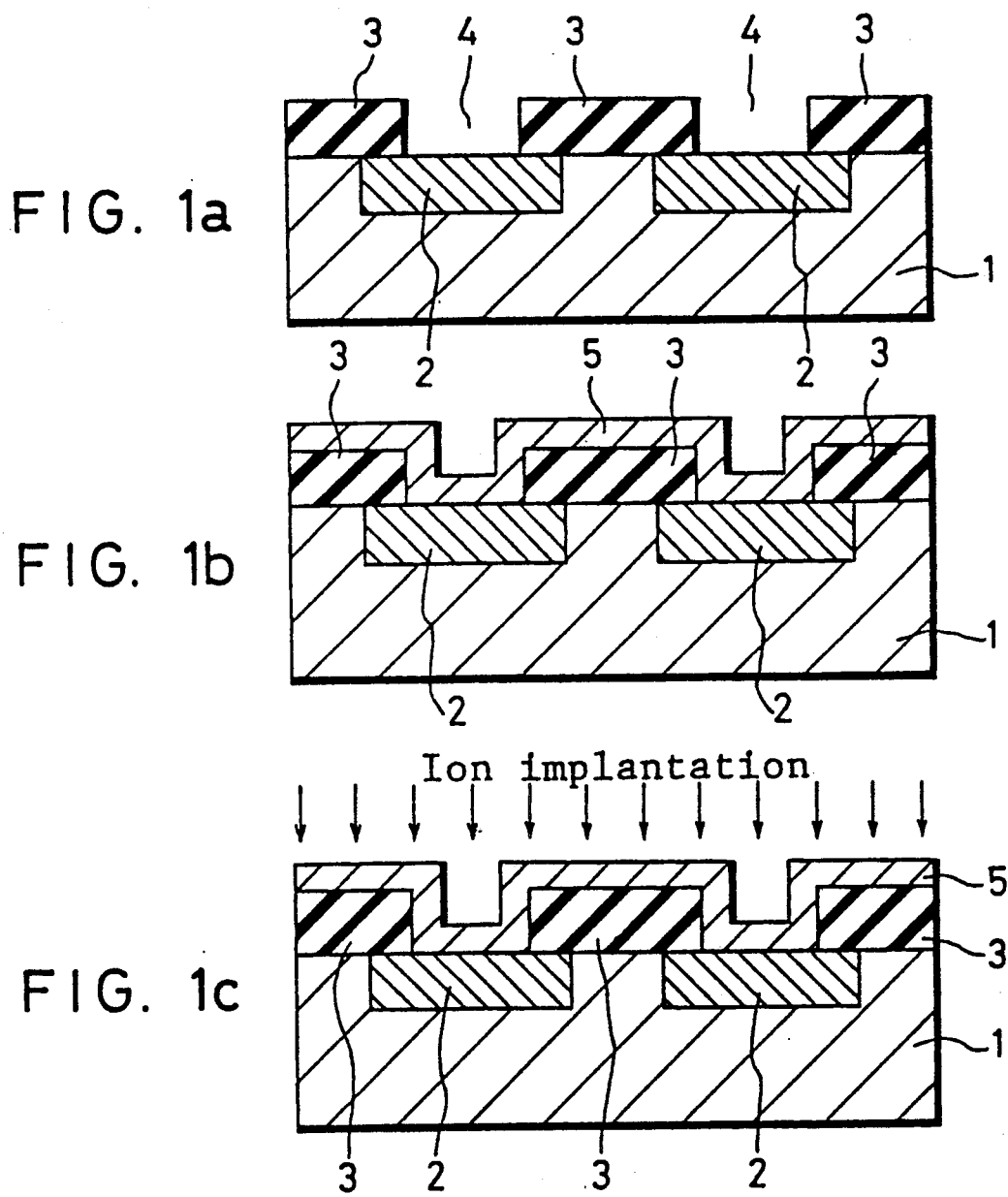
FIGS. 1a, 1b and 1c are cross-sectional views showing successive steps in the performance of a process according to the present invention.

One embodiment of the present invention will be described with reference to FIGS. 1a to 1c. FIG. 1a shows an early fabrication stage where impurity diffusion layers 2 are formed in a semiconductor substrate 1, and after an insulator layer 3 has been formed, contact holes 4 for contact with the impurity diffusion layers 2 are formed in layer 3. In each contact hole 4, the surface of an impurity diffusion layer 2 is exposed. The semiconductor substrate 1 is either a single-element semiconductor substrate, for example, of silicon (Si), or germanium (Ge) or carbon (C), or a compound semiconductor substrate, for example, of gallium arsenide (GaAs) or indium phosphide (InP). The impurity diffusion layer 2 is a conductive layer in the surface of semiconductor substrate 1. For example, in the case of a silicon semiconductor substrate, the impurity diffusion layer 2 is either an N-type impurity layer that contains an N-type impurity element, for example, phosphorus (P), arsenic (As) or antimony (Sb), or a P-type impurity layer that contains a P-type impurity element, for example, boron (B), aluminum (Al), etc. In addition, insulating layer 3 is an insulating film, for example, a silicon oxide film, a silicon nitride film or a silicon oxynitride film.

Next, as shown in FIG. 1(b), a silicide film 5 is deposited, so as to be in contact with impurity diffusion layers 2 through contact holes 4. The silicide film 5 is formed of an alloy of a metal and silicon, for example, tungsten silicide, molybdenum silicide, titanium silicide, cobalt silicide or tantalum silicide. Silicide film 5 may be produced by chemical vapor deposition (CVD) or physical vapor deposition (PVD). Alternatively, silicide film 5 may be formed by causing a deposited metal film to react with silicon (Si). In addition, a thin layer, for example, a polysilicon film, amorphous silicon film, titanium-tungsten or titanium nitride film, may be placed under the silicide film 5 with a view to increasing the adhesion between the silicide film 5 and the insulator 3.

Next, as shown in FIG. 1(c), ion implantation of an impurity element is carried out from above silicide film 5. The acceleration energy for this ion implantation must be selected so that the range (Rp) of the impurity element is in the vicinity of the interface between silicide film 5 and impurity diffusion layer 2. In actual practice, the range (Rp) of the implanted ions of the impurity element needs to be between a location which is 1000Å away from the interface in the direction toward silicide film 5 and a location which is 500Å away from the interface in the direction toward semiconductor substrate 1,2, as shown in FIG. 2.

Figure 2:
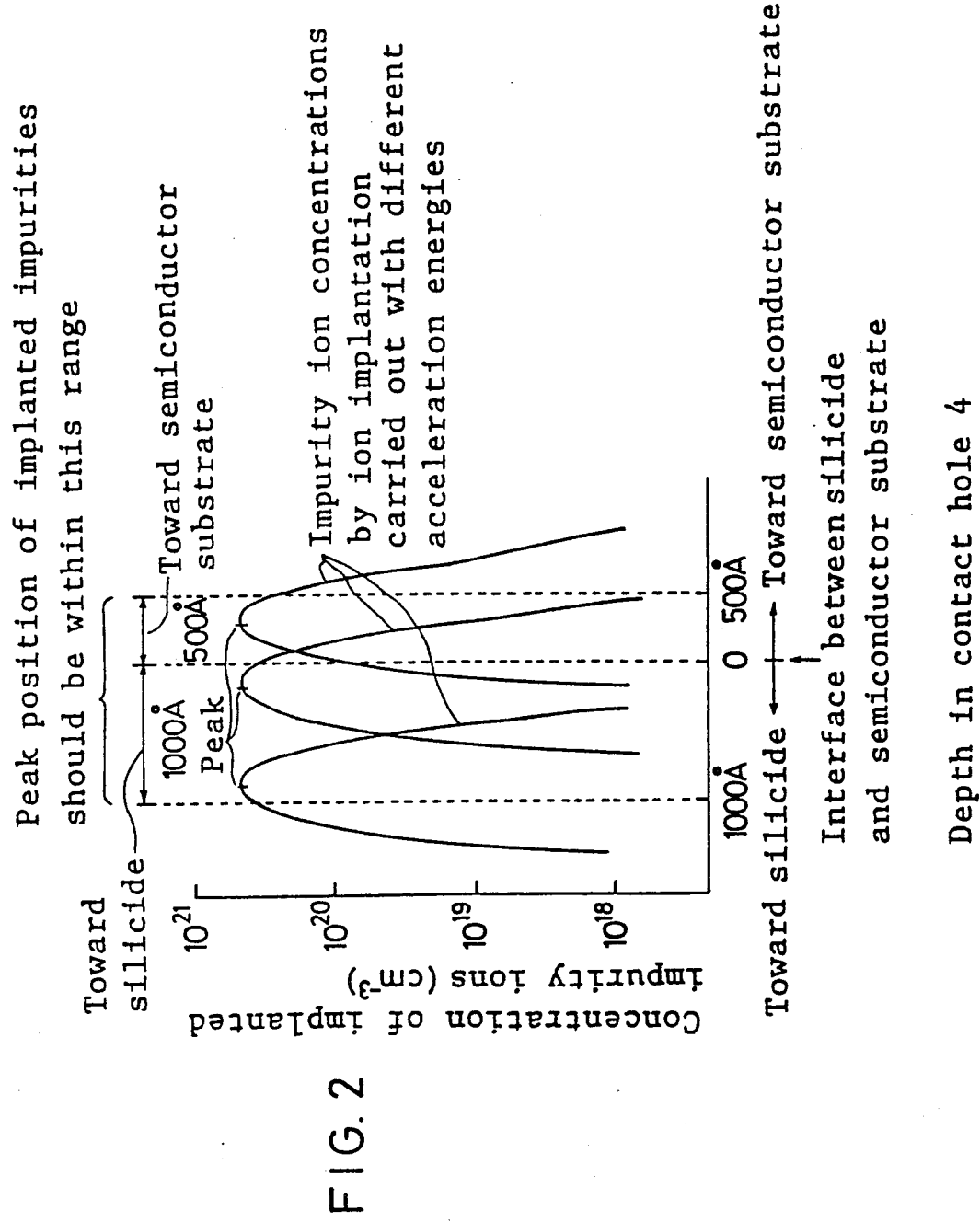
FIG. 2 is a graph showing the depthwise profile of impurity concentrations immediately after the ion implantation performed in the process of FIGS. 1.

FIG. 2 shows various impurity profiles of the ion-implanted impurities in the direction of the depth of each contact hole 4. The impurity ions that are implanted must be of the same conductivity type as that of the impurities employed to form the impurity diffusion layer 2. In other words, if the impurity diffusion layer 2 is of the P type, a P-type impurity element, for example, boron (B), is implanted. The amount of impurity element ions implanted must be selected so that the peak concentration after the ion implantation is higher than the surface concentration of the impurity diffusion layer 2. For example, when the silicide film 5 is a tungsten silicide ($WSi_2$) film 2100Å thick, the acceleration energy for implanting boron ions ($^{11}B+$), which is a P-type impurity element, should be selected to fall within the range of from 80 keV to 150 keV. At this time, ions must be implanted in excess of $3 \times 10^{15}/cm^3$ in the case where the surface concentration of the impurity diffusion layer 2 before the ion implantation is $10^{20}/cm^3$. If the thickness of the tungsten silicide film varies, the acceleration energy for the ion implantation also varies, as a matter of course. In the case of a tungsten silicide film ($WSi_{2.7}$) that is deposited by CVD, the range of implanted B ions is substantially as follows:
80 keV . . . 1520Å
110 keV . . . 2060Å
140 keV . . . 2630Å.

When polysilicon or the like is placed under the silicide film 5, the acceleration energy for the ion implantation must be controlled by taking into consideration the thickness of the polysilicon film. More specifically, the range of implanted ions should be between a location which is 1000Å away from the interface between the polysilicon film and the silicide toward the silicide and a position which is 500Å away from the interface between the polysilicon film and the semiconductor substrate toward the semiconductor substrate. The ion implantation may be carried out from directly above the silicide film 5 or through a thin film (insulator, for example) which is deposited over the silicide film 5.

Figure 4A:
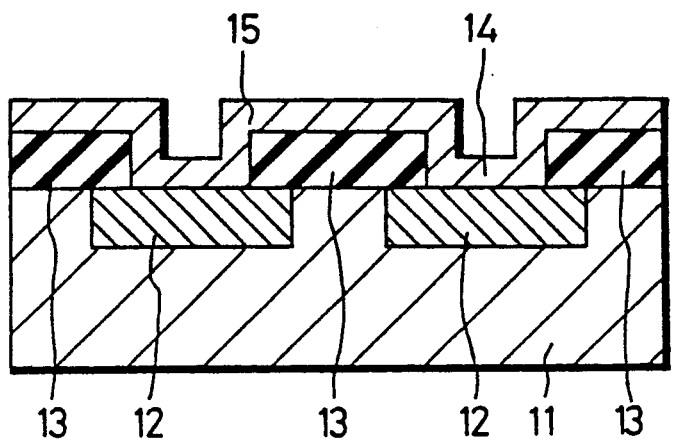
FIGS. 4a and 4b are sectional views showing a process sequence according to the prior art.
Figure 4B:
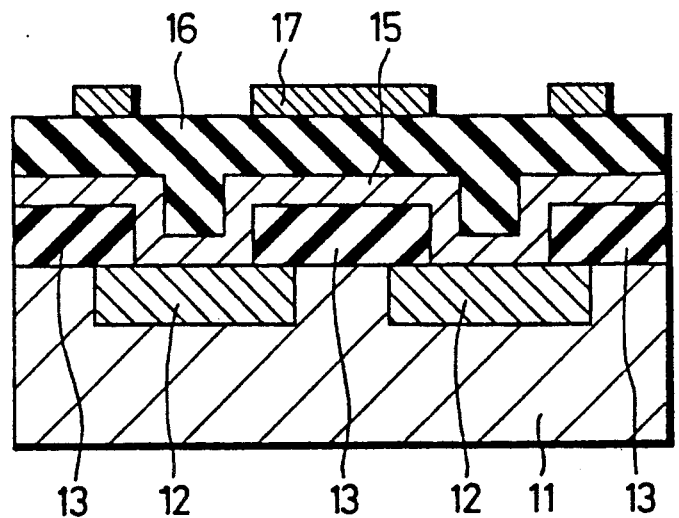

After the step shown in FIG. 1c, an insulator or wiring layer is formed, essentially as shown in FIG. 4b, and a heat treatment is carried out to form a semiconductor device.

Thus, a fundamental feature of the present invention is to implant, after the formation of a silicide layer, impurity ions in the vicinity of the interface between the silicide and an impurity diffusion layer, the ions having the same conductivity type as that of the impurity element that constitutes the impurity diffusion layer.

As has been described with reference to the above embodiments, since the silicide contains a large amount of impurities which are of the same conductivity type as that of the impurity element employed to form the impurity diffusion layer 2, it is possible to prevent the impurity element in the impurity diffusion layer 2 from being absorbed and diffused into the silicide during a heat treatment carried out thereafter, or the amount of impurities diffused into the silicide is very small. In addition, since the silicide contains a large amount of impurity element, it is also possible for the impurity element in the silicide to increase the surface concentration in the semiconductor impurity layer as a result of a heat treatment. FIG. 3 shows, by a broken line, the depthwise profile of boron, as an impurity element, when ion implantation of boron ($^{11}B+$) was carried out at 110 keV to a concentration of $6 \times 10^{15}/cm^3$ from above a tungsten silicide film 2100Å thick deposited on a silicon substrate, and also shows, by a solid line, the depthwise profile of boron after lamp annealing was carried out at 1000° C. for 45 seconds.

FIG. 3 also shows the boron concentration profile in the impurity diffusion layer 2, which was also formed from boron. As is clear from FIG. 3, the boron concentration in the silicon surface, which was $7 \times 10^{19}/cm^3$ before the heat treatment, increased to $1 \times 10^{20}/cm^3$ after the heat treatment. In comparison to the fact that, if no ion implantation were carried out, the surface concentration of boron after the same heat treatment would decrease to $3 \times 10^{19}/cm^3$, it will be understood that the ion implantation according to the invention provides a great advantageous effect. The contact resistance between the silicide and the impurity diffusion layer in this case is $1 \times 10^{-6}$ Ωcm2, whereas in the case where no ion implantation is carried out, even an ohmic contact cannot be obtained and the contact resistance is above $1 \times 10^{-4}$ Ωcm2. In comparison to this fact, it will be understood that there is a great improvement.

As has been described above, by effecting ion implantation after the formation of a silicide film so that the range (Rp) of impurity ions of the same conductivity type as that of impurities in an impurity diffusion layer is in the vicinity of the interface between the silicide film and the impurity diffusion layer, the impurity concentration in the surface region of the impurity diffusion layer is not reduced but increased instead by a heat treatment carried out thereafter. As a result, it becomes possible to lower the contact resistance between the silicide and the impurity diffusion layer.

This application relates to subject matter disclosed in Japanese Application No. 1-249632, filed on Sep. 29, 1989, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A process for producing a semiconductor comprising: providing a semiconductor substrate having an exterior surface; forming impurity diffusion layers int eh substrate so that the layers extend to the exterior surface; forming a film of insulting material on the exterior surface and providing contact holes in the film to expose at least a portion of each impurity diffusion layer; forming a thin layer of a material which adheres well to the film of material and to silicide upon the film of insulating material so that the thin layer extends into the contact holes and forms an interface with the impurity diffusion layers; and forming a silicide film upon the thin layer so that the silicide film extends into the contact holes; and, after said step of forming the silicide film, performing an ion implantation for implanting ions of an impurity element of the same conductivity type as that of said impurity diffusion layers with an implantation energy selected so that the implanted ions have a concentration peak between a location which is 1000Å away from the interface between the thin layer and the silicide film toward the silicide film and a location which is 500 Å away from the interface between the thin layer and the semiconductor substrate toward the semiconductor substrate.

2. A process for producing a semiconductor device according to claim 1, wherein the thin layer is a polysilicon film, an amorphous silicon film, a titanium-tungsten or a titanium nitride film.

3. A process for producing a semiconductor comprising: providing a semiconductor substrate having an exterior surface; forming impurity diffusion layer sin the substrate so that the layers extend to the exterior surface; forming a film of insulating material on the exterior surface and providing contact holes in the film to expose at least a portion of each impurity diffusion layer; forming a silicide film upon the film of insulating material nd in the contact holes; forming a thin layer of material on the silicide film; and performing an ion implantation for implanting ions of an impurity element of the same conductivity type as that of said impurity diffusion layers with an implantation energy selected so that the implanted ions have a concentration peak between a location which is 1000 Å away from the interface between the impurity diffusion layer sand the silicide film toward the silicide film and 500 Å away from the interface toward the impurity diffusion layers.

* * * * *